United States Patent
Kesserwan et al.

(10) Patent No.: US 11,821,861 B2
(45) Date of Patent: Nov. 21, 2023

(54) WETTABILITY ESTIMATION USING MAGNETIC RESONANCE

(71) Applicants: Hasan Kesserwan, Al-Khobar (SA); Shouxiang Ma, Dhahran (SA); Gabor Hursan, Dhahran (SA)

(72) Inventors: Hasan Kesserwan, Al-Khobar (SA); Shouxiang Ma, Dhahran (SA); Gabor Hursan, Dhahran (SA)

(73) Assignees: BAKER HUGHES OILFIELD OPERATIONS LLC, Houston, TX (US); SAUDI ARABIAN OIL COMPANY, Dhahran (SA)

(*) Notice: Subject to any disclaimer, the term of this patent is extended or adjusted under 35 U.S.C. 154(b) by 0 days.

(21) Appl. No.: 17/237,507

(22) Filed: Apr. 22, 2021

(65) Prior Publication Data

US 2022/0341858 A1    Oct. 27, 2022

(51) Int. Cl.
   *G01N 24/08*  (2006.01)
   *G01R 33/50* (2006.01)
   *G01V 3/32*  (2006.01)

(52) U.S. Cl.
   CPC ........... *G01N 24/081* (2013.01); *G01R 33/50* (2013.01); *G01V 3/32* (2013.01)

(58) Field of Classification Search
   CPC ......... G01N 24/081; G01R 33/50; G01V 3/32
   See application file for complete search history.

(56) References Cited

U.S. PATENT DOCUMENTS

| | | | |
|---|---|---|---|
| 7,397,240 B2 | 7/2008 | Fleury et al. | |
| 7,716,028 B2 | 5/2010 | Montaron et al. | |
| 7,893,692 B2 | 2/2011 | Minh | |
| 9,746,576 B2 | 8/2017 | Jebutu et al. | |
| 10,145,774 B2 | 12/2018 | Kwak et al. | |
| 10,422,221 B2 * | 9/2019 | Gzara | G01V 11/002 |
| 2010/0237860 A1 | 9/2010 | Hurlimann et al. | |
| 2012/0136578 A1 | 5/2012 | Ghedan et al. | |
| 2012/0241149 A1 | 9/2012 | Chen et al. | |

(Continued)

OTHER PUBLICATIONS

Tandon, Saurabh, Chelsea Newgord, and Zoya Heidari. "Wettability quantification in mixed-wet rocks using a new NMR-based method." SPE Reservoir Evaluation & Engineering 23.03 (2020): 0896-0916. (Year: 2020).*

(Continued)

*Primary Examiner* — Rishi R Patel
(74) *Attorney, Agent, or Firm* — CANTOR COLBURN LLP

(57) ABSTRACT

A method of estimating a wettability characteristic of a rock and fluid system includes acquiring a sample of the rock material, performing a first nuclear magnetic resonance (NMR) measurement of the sample when the sample is in a full water saturation condition, and measuring a first T2 distribution, performing a second NMR measurement of the sample when the sample is in a second partial saturation condition, and measuring a second T2 distribution. The method also includes separating a hydrocarbon component of the second T2 distribution from a water component of the second T2 distribution, applying a fluid substitution model to the water component of the second T2 distribution to generate a computed T2 distribution, and calculating a wettability index (WI) based on a difference between the first T2 distribution and the computed T2 distribution.

18 Claims, 4 Drawing Sheets

(56) References Cited

U.S. PATENT DOCUMENTS

| | | |
|---|---|---|
| 2013/0261979 A1 | 10/2013 | Al-Muthana et al. |
| 2013/0325348 A1 | 12/2013 | Valori et al. |
| 2016/0334346 A1 | 11/2016 | Minh et al. |
| 2019/0101665 A1 | 4/2019 | Valori et al. |
| 2019/0178824 A1 | 6/2019 | Kwak et al. |

OTHER PUBLICATIONS

Looyestijn, Wim J., and Jan Hofman. "Wettability-index determination by nuclear magnetic resonance." SPE Reservoir Evaluation & Engineering 9.02 (2006): 146-153. (Year: 2006).*

Al-Mahrooqi, S. H., et al. "Pore-scale modelling of NMR relaxation for the characterization of wettability." Journal of Petroleum Science and Engineering 52.1-4 (2006): 172-186. (Year: 2006).*

Looyestijn, W. J. "Wettability index determination from NMR logs." Petrophysics—The SPWLA Journal of Formation Evaluation and Reservoir Description 49.02 (2008). (Year: 2008).*

Al-Muthana et al.; "Wettability as a Function of Pore Size by NMR"; SCA2012-31; International Symposium of the Society of Core Analysts; Aug. 27-30, 2012; 12 Pages.

International Search Report for International Application No. PCT/US2022/025010; International filing date Apr. 15, 2022; dated Jul. 28, 2022; 4 pages.

Sayedakram et al.; "Micro-CT Assisted Interpretation of NMR Responses of Heterogeneous Mixed-Wet Carbonate Rock"; SPWLA 57th Annual Logging Symposium; Jun. 25-29, 2016; 20 Pages.

Written Opinion for International Application No. PCT/US2022/025010; International filing date Apr. 15, 2022; dated Jul. 28, 2022; 4 pages.

* cited by examiner

WETTABILITY ESTIMATION USING MAGNETIC RESONANCE

BACKGROUND

Understanding the characteristics of geologic formations and fluids located therein is important for effective hydrocarbon exploration and production. For example, accurate estimation of the wetting characteristics of in-situ reservoir (rock and fluids) is important for evaluation of hydrocarbon recovery, selection of production mechanisms and understanding of field development economics.

Magnetic resonance tools can be used to estimate characteristics of reservoirs, such as permeability and fluid viscosity. Such tools can be conveyed into a borehole during drilling (e.g., as logging-while-drilling tools) or after drilling (e.g., as wireline tools). In addition, magnetic resonance measurements on core samples can provide valuable insight into properties of rocks and fluids. Characterization of the formations and the fluids within provides valuable information related to the intended use of the formation so that drilling and production resources can be used efficiently.

SUMMARY

An embodiment of a method of estimating a wettability characteristic of a rock and fluid system includes acquiring a sample of the rock material, performing a first nuclear magnetic resonance (NMR) measurement of the sample when the sample is in a full water saturation condition, and measuring a first T2 distribution, performing a second NMR measurement of the sample when the sample is in a second partial saturation condition, and measuring a second T2 distribution. The method also includes separating a hydrocarbon component of the second T2 distribution from a water component of the second T2 distribution, applying a fluid substitution model to the water component of the second T2 distribution to generate a computed T2 distribution, and calculating a wettability index (WI) based on a difference between the first T2 distribution and the computed T2 distribution.

An embodiment of a system for estimating a wettability characteristic of a rock material includes a nuclear magnetic resonance (NMR) device configured to perform NMR measurements of a sample of a rock material, and a processor configured to perform a method that includes performing a first NMR measurement of the sample when the sample is in a full water saturation condition, measuring a first T2 distribution, performing a second NMR measurement of the sample when the sample is in a second partial saturation condition, and measuring a second T2 distribution. The method also includes separating a hydrocarbon component of the second T2 distribution from a water component of the second T2 distribution, applying a fluid substitution model to the water component of the second T2 distribution to generate a computed T2 distribution, and calculating a wettability index (WI) based on a difference between the first T2 distribution and the computed T2 distribution.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
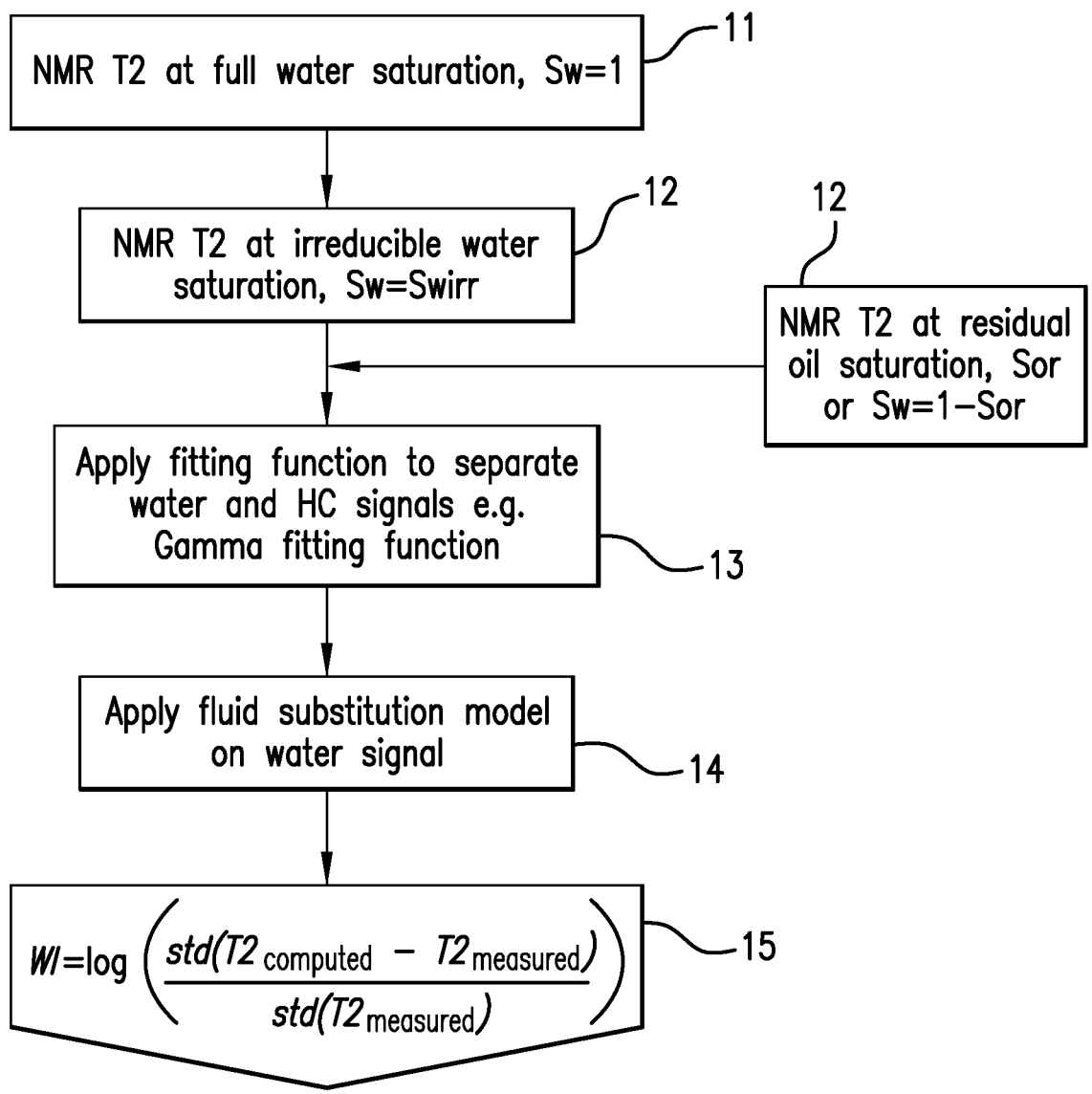
FIG. 1 is a flow diagram depicting an embodiment of a method of generating nuclear magnetic resonance measurements and estimating wettability characteristics of a rock material.

Apparatuses and methods for characterizing subterranean regions are described herein. An embodiment of a method includes determining wettability characteristics of a subterranean system of solids and fluids (e.g., a downhole region or core sample) based on nuclear magnetic resonance (NMR) measurements. The wettability may be characterized as an index or other value. In an embodiment, the method characterizes wettability using an NMR fluid substitution (FS) model that is configured to reconstruct T2 distributions of a water wet rock under a fully water saturated (100% water saturation) condition. "Rock" is intended to indicate any combination of geological materials that may be found in a subterranean region. The measurements are performed under various oil and/or water saturation conditions. "Oil" is intended to indicate any combination of one or more hydrocarbons.

In an embodiment, the method includes taking NMR measurements of a rock sample (e.g., a core sample taken via a borehole) under various applied fluid conditions. For example, a water-based fluid (e.g., brine) is applied to the sample to fully saturate the sample, and a first NMR measurement is performed when the sample is in the full water saturation condition to generate a first T2 distribution. The fluid condition is modified to put the sample in a second saturation condition (e.g., irreducible water saturation or residual oil saturation), and a second NMR measurement is performed to generate a second T2 distribution. The second T2 distribution is analyzed (e.g., via a fitting function) to separate the second T2 distribution into a water component (water signal) and an oil component (also referred to as an oil signal or a hydrocarbon (HC) signal), and the FS model is applied to the water component to shift and/or amplify the water component to generate a computed T2 distribution. The computed T2 distribution represents a T2 distribution that would be created if the sample was water-wet and fully saturated with water.

In an embodiment, a wettability index (WI) is calculated based on the first measured T2 distribution and the computed T2 distribution constructed using the FS model. For example, the wettability index developed is defined as the difference between two fully water saturated (Sw=1) T2 distributions, i.e., one measured T2 distribution from a fully water saturated sample, and one computed T2 distribution based on the fluid substitution model. The reconstructed or computed T2 distribution is obtained, in an embodiment, from either irreducible water saturation (Swirr) or residual oil saturation (Sor).

In the FS model, the rock sampled is assumed to be strongly water wet, where a water film covers the surface of the grains at irreducible water saturation. After removal of the HC signal, the model utilizes a saturation function to calculate the irreducible water saturation and a pore size dependent correction model to calculate the movable water distribution. A T2 distribution applied to the FS model is shifted accordingly using a saturation dependent mapping relation.

As noted above, the FS model constructs a T2 distribution from a measured distribution under an assumption that the sample is water wet and fully water saturated. The FS model thus reproduces the fully water saturated response (T2 distribution) in water wet rocks. In a water wet rock, the sample strongly prefers contact with water, and there is a clear separation between water and hydrocarbon signals in NMR measurement data.

Wettability is the measure of the preferential tendency of a fluid to wet a rock surface in the presence of other fluids. Wettability is an important reservoir property that affects other properties such as capillary pressure, relative permeability, and saturation distributions. In general, wettability characterization is very challenging due to the many factors that control the wetting behavior, such as rock composition, micro-structure and fluid properties.

NMR measures the characteristic relaxation times of pore fluids following excitation with external magnetic fields. Several factors affect overall relaxation dynamics such as properties of fluid and positions of fluid in the pore space. Hence, the obtained relaxation time distributions can provide important information on the fluid and rock properties, and surface properties such as wettability. NMR-based methods provide the ability to assess rock-fluid interaction via its characteristic surface relaxation mechanism. In the fast diffusion regime, the NMR surface relaxation dominates the bulk and the diffusion relaxation mechanisms. Thus, the surface relaxation can directly correlate with wettability.

Embodiments described herein characterize and quantify wettability using an NMR fluid substitution (FS) model, which is configured to reconstruct full (100%) water saturation distribution of water-wet rock. In such a model, the rock is assumed to be water-wet, i.e., a clear separation between water and hydrocarbon (HC) signals exists in a measured T2 distribution. Application of the FS model will reproduce the fully water saturated response in water wet rocks.

As reservoirs in many instances are not fully water wet, but are instead mixed wet (wet with water and HC), the FS model will not fully reconstruct the original T2 distribution. Embodiments described herein utilize this property of the FS model to provide a relatively simple and fast method to estimate wettability. As discussed further herein, wettability characteristics derived according to embodiments herein can be used in various applications, such as improving or calibrating models, improving surface and sub-surface downhole measurement techniques, planning downhole operations and/or controlling aspects of downhole operations.

The fluid substitution (FS) model takes into account multiple fluid types, broad pore size distributions, and complex pore connections. This model is based on differentiating the total water saturation and effective pore water saturation. In an embodiment, the FS model uses an irreducible water model (instead of using a fixed T2 cutoff of immobile water) to separate the incremental porosity distribution of immobile water from the incremental porosity distribution for pore volumes that are occupied by mobile fluids including mobile water and mobile hydrocarbons. The total porosity may be used as a constraint to determine the effective water saturation in the rock pore space, sometimes called pore water saturation.

The following is a description of an embodiment of the FS mode. In this embodiment, the FS model includes an irreducible water model represented by p(m), and an effective pore water saturation model. The effective pore water saturation model relates apparent T2 relaxation times for a partially saturated condition (e.g., Swirr or 1−Sor) to a fully water saturated T2 distribution.

The irreducible water model, in an embodiment, is represented by the following equations:

$$p(m) = 1, m \leq m_{cutoff}, \text{ and}$$

$$p(m) = \frac{T_{2a,innert,cutoff}}{T_{2a,innert,m}}\left[a\left(1 - \frac{T_{2a,innert,cutoff}}{T_{2a,innert,m}} + \left(\frac{T_{2a,innert,cutoff}}{T_{2a,innert,m}}\right)^q\right)\right], m > m_{cutoff}$$

where $T_{2a}$ is an apparent relaxation time calculated from a given NMR measurement (Its inverse is the sum of surface relaxation rate, bulk fluid relaxation rate, and diffusion relaxation rate). p(m) is volume fraction of irreducible water associated with the m-th bin of apparent T2 relaxation time. $m_{cutoff}$ is the T2 relaxation time (bin) to separate incremental porosities fully occupied by irreducible water and incremental porosities partially occupied by irreducible water.

$T_{2a,innert,cutoff}$ is a maximum bin of apparent T2 relaxation time in which incremental porosity of partially water saturated rock overlaps with incremental porosity of fully water saturated rock. $T_{2a,innert,m}$ is the m-th bin of apparent T2 relaxation time of irreducible water;

a and q are coefficients in the equations that represent the influence of immobile water on NMR measurements, and may be based on the lithology of s sample. a is a parameter associated with pore geometry and surface relaxation, and q is a parameter associated with pore connection. These parameters are affected by rock type. For example, for shaly sandstone, a will have a large value, while q may have a negative value which is associated with inaccessible large pores in rock.

The term "bin" relates to an incremental range of T2 distributions used for performing calculations. Multiple bins are used to cover the range of interest of T2 distributions in order to simplify processing.

The effective pore water saturation model, in an embodiment, is represented by:

$$s_{eff,pore,W,n,r_n} = \Delta s_{pore,W} f(n), \quad \text{Equation (1)}$$

$$f(n) = 1, \text{ or}$$

$$f(n) = NT_2 - an, \text{ or}$$

$$f(n) = NT_2 - an - bn^2, \text{ or}$$

$$f(n) = NT_2 - an - bn^2 - cn^3$$

In the above equations, $s_{eff,pore,W,n,rn}$ is effective water saturation for pore size m (associated with the nth bin of a T2 relaxation time), and $\Delta S_{pore,W}$ is a constant discussed further below. $NT_2$ is the total number of bins of T2 relaxation time, and a, b and c are parameters for modeling the non-constant effective water saturation at the pore level of a rock when fluids in pores are at a non-equilibrium state. When fluids in the rock are at a state of equilibrium status, the its effective pore water saturation is $\Delta S_{pore,W}$, i.e., f(n)=1.

In an embodiment, the FS model utilizes a total porosity constraint that is used to determine the effective pore water saturation. The total porosity constraint is represented by the following equations:

$$\sum_k \phi_{innert,k}^{(f)} + \sum_i \phi_{BVW,i,r_i}^{(f)} = \phi_T,$$

$$\sum_n \phi_{BVW,n,r_n}^{(p)} + \sum_m \phi_{BVHC,m,r_m}^{(p)} + \sum_k \phi_{innert,k}^{(p)} = \phi_T,$$

$$\sum_k \phi_{innert,k}^{(p)} + \sum_n \phi_{BVW,r_n}^{(n)} = \sum_j \phi_{w,r_j}^{(p)} = s_{T,w}\phi_T, \text{ and}$$

$$\phi_{innert,m}^{(f)} = \phi_{innert,m}^{(p)}$$

where:
(p) represents a partially water saturated condition;
(f) represents a fully water saturated condition;
innert refers to not movable water (irreducible water);
$\phi_T$ is total porosity;
$\phi_{innert,k}^{(f)}$ is incremental porosity associated with the kth bin of T2, which is occupied by the irreducible water in fully water saturated rock;
$\phi_{innert,k}^{(p)}$ is incremental porosity associated with the kth bin of T2, which is occupied by the irreducible water in partially water saturated rock;
$\phi_{BVW,t,rt}^{(f)}$ is incremental porosity for a pore size ri (associated with the ith bin of T2) of mobile water (free water or BVM) in partially water saturated rock;
$\phi_{BVCH,m,rm}^{(p)}$ is incremental porosity for pore size rm (associated with the mth bin of T2) of mobile hydrocarbons (HC) in partially water saturated rock;
$\phi_{BVW,n,rn}^{(p)}$ is incremental porosity for pore size rn (associated with the nth bin of T2) of mobile water in partially water saturated rock;
$\phi_{w,rj}^{(p)}$ is incremental porosity for pore size rj of the wetting phase (water) in partially water saturated rock; and
$S_T,w$ is total water saturation.

Using the total porosity constraint, the constant $\Delta s_{pore,W}$ can be determined based on the following equation:

$$\Delta s_{pore,W} = \frac{1}{\phi_T - \sum_m \phi_{innert,m}^{(f)}} \sum_n \frac{\phi_{W,n,r_n}^{(p)}}{f(n)} = \frac{1}{\phi_T - \sum_m \phi_{innert,m}^{(f)}} \sum_n \frac{\phi_{w,r_n}^{(p)} - \phi_{innert,n}^{(p)}}{f(n)}.$$

if the fluids in the rock are at the equilibrium status (f(n)=1), then the effective water saturation is determined from equation (1) above.

In an embodiment, two relaxation time relationships (mapping relations) are used to reconstruct the T2 distribution of the fully water saturated rock. For the incremental porosities occupied by the irreducible water, their corresponding T2 bins are the same for the fully water saturated rock and partially water saturated rock, i.e.

$$T_{2a,innert,m}^{(f)} = T_{2a,innert,m}^{(p)}.$$

For the incremental porosities occupied by the mobile fluid of wily water saturated rock, their corresponding T2 bins can be determined by the following mapping relationship between the T2 bin of the fully water saturated rock and T2 bin of partially water saturated rock:

$$\frac{1}{T_{2a,BVW,n,r_n}^{(f)}} = \frac{1}{T_{2B,BVW}} + s_{eff,pore,BVW,n,r_n}^{(p)} \left( \frac{1}{T_{2a,BVW,n,r_n}^{(p)}} - \frac{1}{T_{2B,BVW}} \right),$$

where $T_{2B,BVW}$ is the T2 transverse relaxation time of bulk water, $T_{2a}^{(p)}{}_{BVW,w,rn}$ is the nth bin of the apparent T2 relaxation time of the mobile water for the partially water saturated rock, and $T_{2a}^{(f)}{}_{BVW,w,rn}$ is the nth bin of apparent T2 relaxation time of mobile water for a fully water saturated rock. $s_{eff,pore,BVW,n,rn}^{(p)}$ is the effective pore water saturation corresponding to the nth bin of the apparent T2 relaxation time of the mobile water for the partially water saturated rock.

FIG. 1 illustrates a method 10 of estimating characteristics of an earth formation, including wettability characteristics. The method 10 may be performed in conjunction with any measurement system. The method 10 includes one or more stages 11-15. In an embodiment, the method 10 includes the execution of all of the stages 11-15 in the order described. However, certain stages may be omitted, stages may be added, or the order of the stages changed.

At least part of the method 10 is performed on a sample of a subterranean region, such as a sample of sandstone or other porous rock. The sample is disposed in a testing system located in a laboratory or other surface location. The sample may be a core sample (or simply "core") acquired by extracting the core sample via a borehole. The sample may be initially cleaned and dried to remove any fluids.

In the first stage 11, the sample is processed by applying a water-based solution (e.g., water or brine), so that the sample is at full water saturation. NMR measurement signals are applied, and a first T2 distribution (T2$_{measured}$) is estimated. This is performed, for example, by disposing the sample in a core holder of a testing system.

In the second stage 12, fluid displacement is conducted on the fully water saturated sample prepared in the first stage to establish partial saturation, such as irreducible water saturation (Swirr) and/or at residual oil saturation (Sw=1−Sor).

A second T2 distribution is estimated from NMR measurements on the sample when the sample is at a second saturation condition, such as irreducible water saturation (Swirr) and/or at residual oil saturation (Sw=1−Sor). In an embodiment, the second T2 distribution is measured at either Swirr or Sor. It is noted that the second T2 distribution may be estimated based on a combination of multiple NMR measurements of the sample.

In the third stage 13, a fitting function is applied to the second T2 distribution (measured under the second or partially saturated condition) to separate components of the T2 distribution into a constituent distribution for water (water signal) and a constituent distribution for hydrocarbons (HC signal). Any suitable fitting function may be used. An example of a fitting function is a Gamma fitting function.

Figure 2:
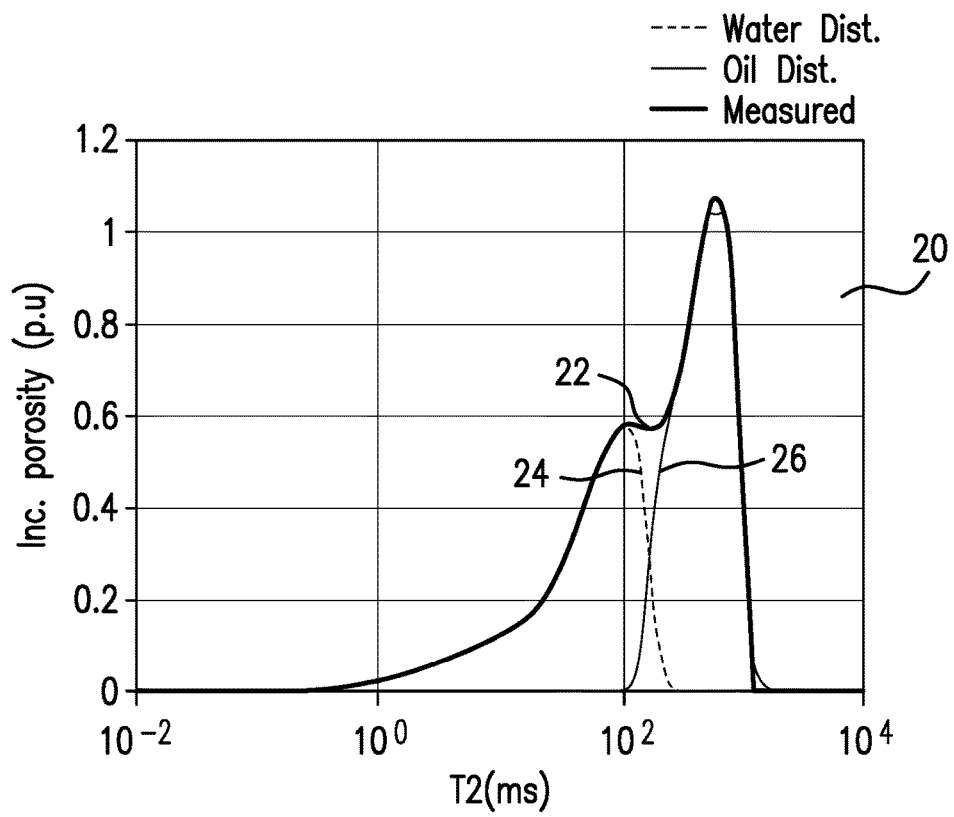
FIG. 2 depicts an example of a fitting function configured to be applied to a T2 distribution derived from an NMR measurement.

FIG. 2 is a graph 20 of a T2 distribution measured for a partially saturated sample, which depicts an example of an application of a gamma fitting function to a T2 distribution. Curve 22 represents the measured T2 distribution, curve 24 represents a separated water signal, and curve 26 represents a separated HC or oil signal.

In the fourth stage 14, the FS model is applied to the separated water signal (e.g., curve 24). For example, the separated water signal is represented is applied to the FS model as bins represented by $T_{2a}^{(p)}{}_{BVW,n,rn}$ (see above). The T2 distribution computed using the FS model (T2$_{computed}$) is based on the bins $T_{2a}^{(f)}{}_{BVW,w,rn}$.

In the fifth stage 15, a wettability index (WI) is calculated based on a difference between the first T2 distribution (T2$_{measured}$) and the T2 distribution computed using the FS model (T2$_{computed}$). An example of the wettability index is represented by:

$$WI = \log\left(\frac{std(T2_{computed} - T2_{measured})}{std(T2_{measured})}\right)$$

The samples are treated with oil-based fluid includes an oil (e.g., synthetic oil) with various concentrations of surfactants and/or emulsifiers, to alter the wettability of the sample toward oil wetting. The above stages from first to fifth are repeated to generate a range of wettabilities to test the validity of the method.

The method 10 may further include performing various actions using the wettability index and/or other data related to the sample. For example, the wettability index may be applied to downhole or surface NMR measurements of a subterranean region. The wettability index may be used planning a downhole operation and/or adjusting an operational parameter of the downhole operation based on downhole NMR measurements.

In one embodiment, the wettability index and other characteristics of the sampled are integrated into a reservoir model. For example, a reservoir model of grain size, lithology and/or fluid types and volumes can be generated using the wettability characteristics, as well as any other characteristics (e.g., permeability, porosity, fluid composition) derived from NMR and/or other data. Additional data can be incorporated in the model from various sources, such as logging data, core data, fluid sample data, core flood experiment data, temperature data, pressure data, and others.

One example of a reservoir model is generated using wettability characteristics to estimate the distribution of fluids in the reservoir, which provides an estimate of the relative volumes of fluids (e.g., oil and water), as well as their distribution. The model can also be used to identify the location and extent of transition zones. An exemplary model incorporates wettability, chemical composition and interfacial tension characteristics.

Embodiments described herein present a number of advantages. For example, as rocks may not be homogenously water-wet (e.g., a rock is hydrocarbon-wet or mixed-wet), the FS model may not reconstruct the original NMR T2 distribution. Embodiments leverage the differences between measured and calculated T2 distributions in an effective and computationally efficient manner to determine wettability characteristics. The embodiments are fast and reliable, and thus advantageous over other techniques, such as Amott-Harvey (AH) and USBM (US Bureau of Mines), which can be tedious, time consuming, and only applicable in surface laboratory tests. In the proposed method, only two saturation conditions are required: full water saturation (Sw=1) and either irreducible water saturation (Swirr) or residual oil saturation (Sor).

Figure 3A:
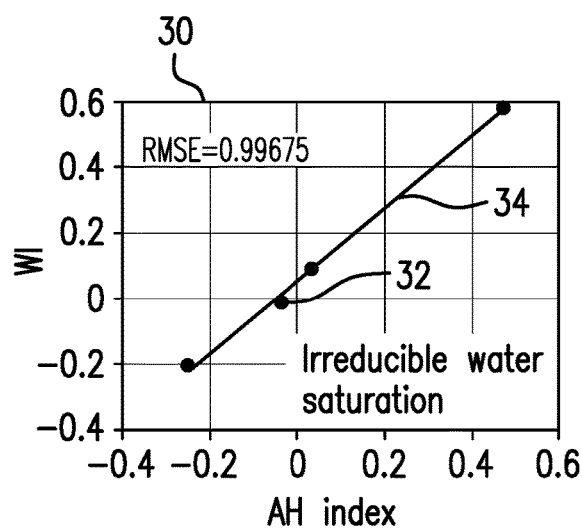
FIGS. 3A and 3B depict examples of a comparison between wettability indexes calculated according to an embodiment, and wettability indexes calculated according to a conventional technique.
Figure 3B:
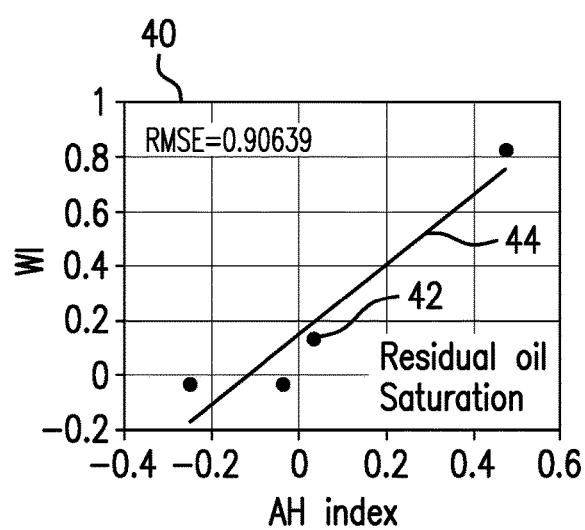

FIGS. 3A and 3B depict examples of results of wettability index (WI) calculated according to embodiments described herein, as compared to results of using the Amott-Harvey (AH) method. Results were cross-plotted. The sample in these examples was sandstone. FIG. 3A is a cross-plot 30 including points 32 and a line 34 showing correlation between WI calculated from method 10 at Swirr, and WI calculations using the AH method. FIG. 3B is a cross-plot 40 including points 42 and a line 44 showing correlation between WI calculated from method 10 of this invention at 1−Sor and WI calculations using the AH method. The cross-plots shows strong correlation, with R2~0.99 for irreducible water saturation and ~0.9 for residual oil saturation.

Figure 4:
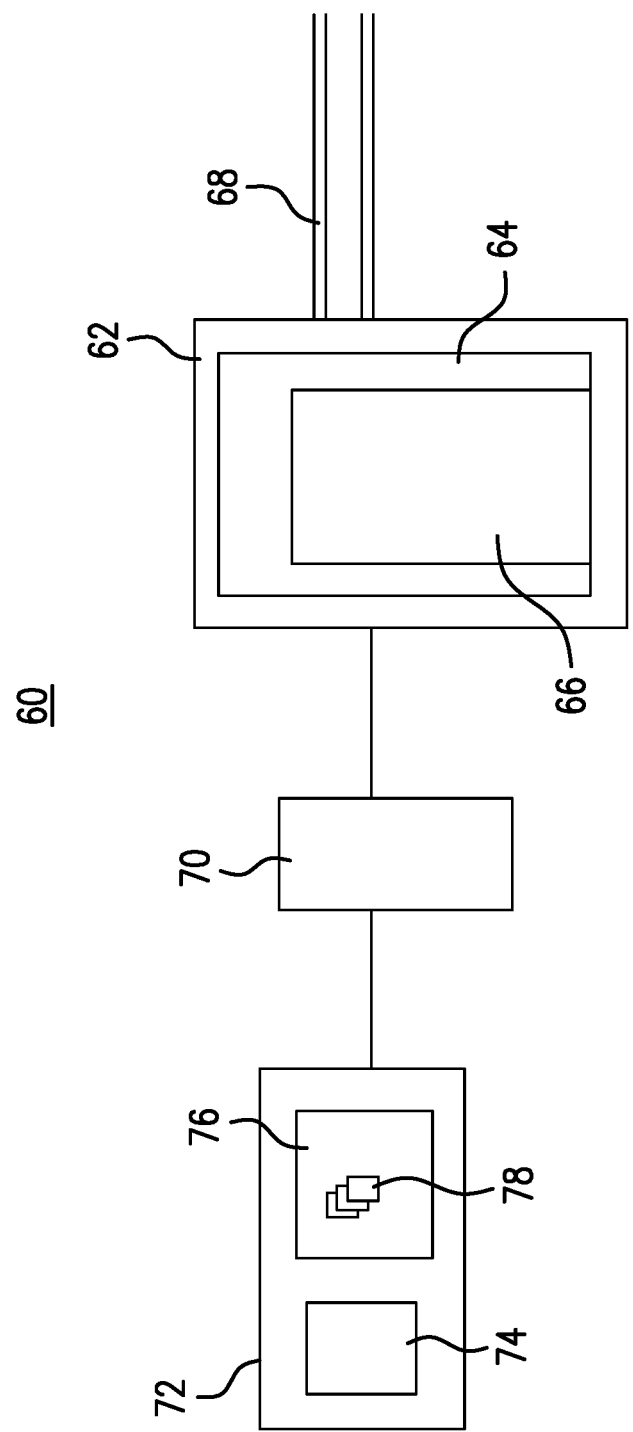
FIG. 4 depicts an example of an analysis system configured to perform one or more aspects of the method of FIG. 1.

FIG. 4 depicts an example of a core analysis system 60 that may be used to perform the methods described herein. The core analysis system 60 includes a core holder assembly 62 having a holding chamber 64. The holding chamber 64 is configured to hold a core sample 66 and is used to apply various conditions to the core sample 66. Examples of such conditions include temperature, pressure and type of fluid applied to the core sample. One or more fluid lines 68 connect to fluid sources and allow various fluids (e.g., brine, oil-based fluids and others) to be injected into the holding chamber at controlled temperature, pressure and/or flow rates.

The core analysis system also includes an NMR measurement device 70 coupled to the holding chamber 64 for applying static magnetic fields and pulsed magnetic fields to the core sample 66, and for measuring core response. An analysis unit 72, which may be any type of processing device or system, is configured to receive measurement signals and perform the various analyses and methods described herein. The analysis unit 72 may also control aspects of fluid injection and control of conditions applied to the core sample 66. The analysis unit 72 includes a processor 74 and a memory 76 that stores one or more processing modules or programs 78 for processing NMR measurement data. The analysis unit 72 may also be configured to provide experimental results and other data to a user and/or other device. For example, the data can be transmitted to an operator or control device for purposes of planning stimulation or other operations and/or controlling operational parameters of such operations.

Figure 5:
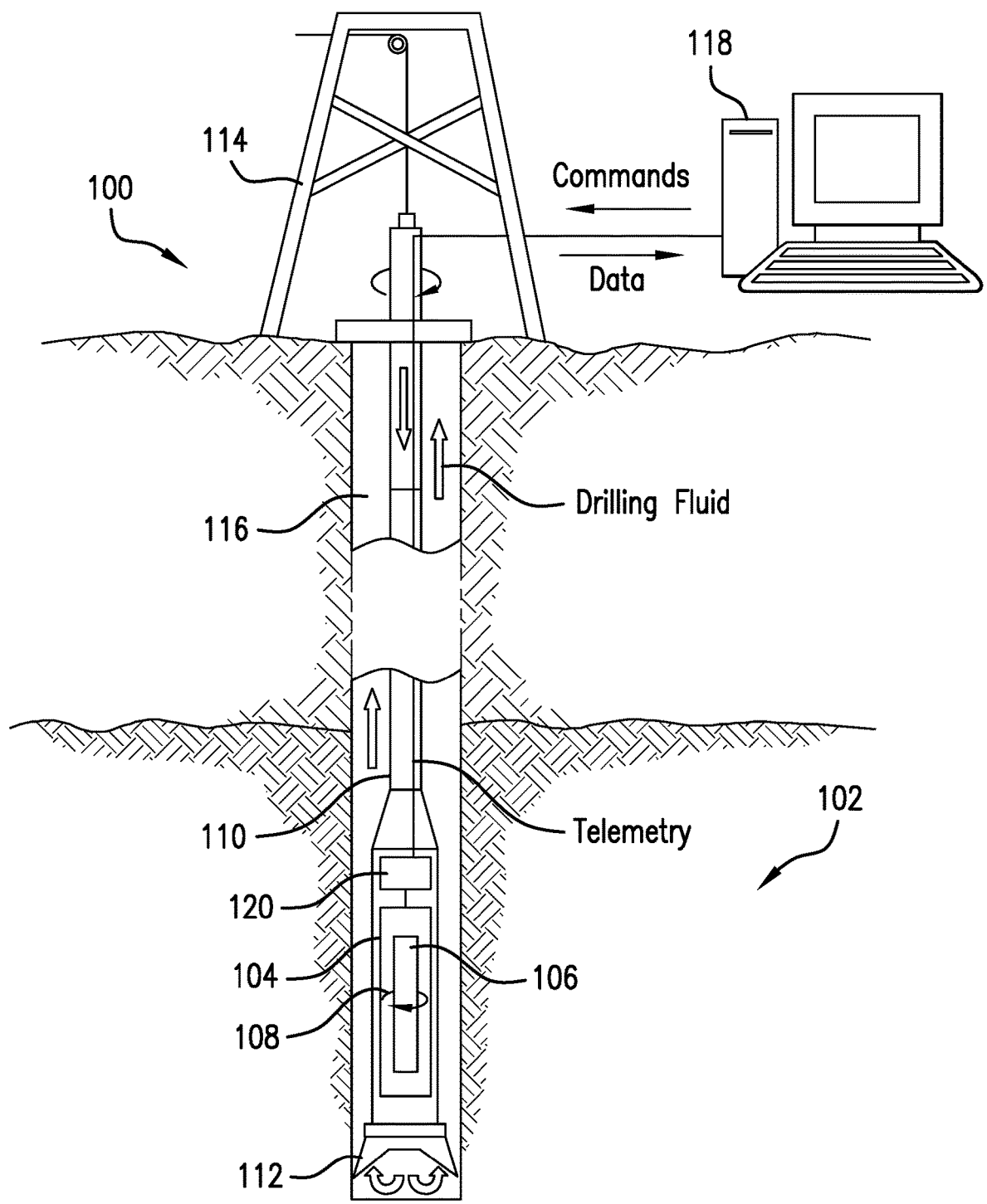
FIG. 5 depicts an example of a system for performing downhole operations.

FIG. 5 illustrates an example of a system 100 for performing energy and other industry operations, which can incorporate NMR tools and processing devices for performing aspects of embodiments described herein. The system 100, in this example, is a drilling and measurement system. The system 100 is not so limited, and may be configured to perform any industry operation, such as a stimulation, measurement and/or production operation, or any other operation related to exploration, recovery of resources such as oil and gas, or evaluating subsurface formations that may be contaminated by oil.

The system 100 includes devices or systems for in-situ measurement of characteristics of a subterranean region, such as an earth formation 102. The system 100 includes a measurement apparatus such as a measurement tool 104 configured to perform NMR measurements. In this embodiment, the measurement tool 104 is part of a logging-while-drilling (LWD) sub or assembly, but is not so limited.

An exemplary tool 104 includes a magnetic field source 106, such as one or more permanent magnets or ferrites, and an antenna 108 for transmitting and/or receiving electromagnetic signals. A single antenna 108 may be used as a transceiver for both transmitting and receiving signals, or there may be separate transmit and receive antennas 108.

The tool 104 may be configured as a component of various subterranean systems, such as wireline well logging and LWD systems. For example, the tool 104 can be incorporated within a drill string 110 including a drill bit 112 or other suitable carrier and deployed downhole, e.g., from a drilling rig 114 into a borehole 116 during a drilling operation. The tool 104 is not limited to the embodiments described herein, and may be deployed in conjunction with any downhole component or string component, such as casing pipe, wireline, wireline sondes, downhole subs and bottom-hole assemblies (BHAs).

In one embodiment, the tool 104 and/or other downhole components are equipped with transmission equipment to communicate ultimately to a surface processing unit 118. Such transmission equipment may take any desired form, and different transmission media and methods may be used, such as wired, fiber optic, and/or wireless transmission methods. Additional processing units may be deployed with the drill string 110 and/or the LWD system. For example, a downhole electronics unit 120 includes various electronic components to facilitate receiving signals and collect data, controlling antennas, effecting impedance control, transmitting data and commands, and/or processing data downhole. The surface processing unit 118, electronics 120, the tool 104, and/or other components of the system 10 include devices as necessary to provide for storing and/or processing data collected from the tool 104 and other components of the system 10. In addition, the surface processing unit may perform aspects of measurements and analyses discussed herein. Exemplary devices include, without limitation, at least one processor, storage, memory, input devices, output devices, and the like.

Set forth below are some embodiments of the foregoing disclosure:

Embodiment 1: A method of estimating a wettability characteristic of a rock and fluid system, comprising: acquiring a sample of the rock material; performing a first nuclear magnetic resonance (NMR) measurement of the sample when the sample is in a full water saturation condition, and measuring a first T2 distribution; performing a second NMR measurement of the sample when the sample is in a second partial saturation condition, and measuring a second T2 distribution; separating a hydrocarbon component of the second T2 distribution from a water component of the second T2 distribution; applying a fluid substitution model to the water component of the second T2 distribution to generate a computed T2 distribution; and calculating a wettability index (WI) based on a difference between the first T2 distribution and the computed T2 distribution.

Embodiment 2: The method of any prior embodiment, wherein the second saturation condition is an irreducible water saturation (Swirr) condition or a residual oil saturation (1−Sor) condition.

Embodiment 3: The method of any prior embodiment, wherein the fluid substitution model is configured to generate the computed T2 distribution based on an assumption that the sample is water wet and fully saturated with water.

Embodiment 4: The method of any prior embodiment, wherein the fluid substitution model includes a plurality of mapping relations configured to map the water component of the second T2 distribution to the computed T2 distribution under the assumption, and a total porosity constraint.

Embodiment 5: The method of any prior embodiment, wherein the fluid substitution model includes an irreducible water model and a pore water saturation model, and a total porosity constraint.

Embodiment 6: The method of any prior embodiment, further comprising applying a fitting function to separate the hydrocarbon component and the water component from the second T2 distribution.

Embodiment 7: The method of any prior embodiment, wherein the fitting function is a gamma fitting function.

Embodiment 8: The method of any prior embodiment, wherein the wettability index is calculated based on:

$$WI = \log\left(\frac{std(T2_{computed} - T2_{measured})}{std(T2_{measured})}\right),$$

wherein T2computed is the computed T2 distribution, and T2measured is the first T2 distribution.

Embodiment 9: The method of any prior embodiment, further comprising applying the wettability index to downhole or surface NMR measurements of a subterranean region.

Embodiment 10: The method of any prior embodiment, further comprising performing at least one of planning a downhole operation and adjusting an operational parameter of the downhole operation based on the downhole measurements.

Embodiment 11: A system for estimating a wettability characteristic of a rock material, the apparatus comprising: a nuclear magnetic resonance (NMR) device configured to perform NMR measurements of a sample of a rock material; and a processor configured to perform a method including: performing a first NMR measurement of the sample when the sample is in a full water saturation condition, and measuring a first T2 distribution; performing a second NMR measurement of the sample when the sample is in a second partial saturation condition, and measuring a second T2 distribution; separating a hydrocarbon component of the second T2 distribution from a water component of the second T2 distribution; applying a fluid substitution model to the water component of the second T2 distribution to generate a computed T2 distribution; and calculating a wettability index (WI) based on a difference between the first T2 distribution and the computed T2 distribution.

Embodiment 12: The system of any prior embodiment, wherein the second saturation condition is an irreducible water saturation (Swirr) condition or a residual oil saturation (1−Sor) condition.

Embodiment 13: The system of any prior embodiment, wherein the fluid substitution model is configured to generate the computed T2 distribution based on an assumption that the sample is water wet and fully saturated with water.

Embodiment 14: The system of any prior embodiment, wherein the fluid substitution model includes a plurality of mapping relations configured to map the water component of the second T2 distribution to the computed T2 distribution under the assumption.

Embodiment 15: The system of any prior embodiment, wherein the fluid substitution model includes an irreducible water model and a pore water saturation model, and a total porosity constraint.

Embodiment 16: The system of any prior embodiment, wherein the method further includes applying a fitting function to separate the hydrocarbon component and the water component from the second T2 distribution.

Embodiment 17: The system of any prior embodiment, wherein the fitting function is a gamma fitting function.

Embodiment 18: The system of any prior embodiment, wherein the wettability index is calculated based on:

$$WI = \log\left(\frac{std(T2_{computed} - T2_{measured})}{std(T2_{measured})}\right),$$

wherein T2computed is the computed T2 distribution, and T2measured is the first T2 distribution.

Embodiment 19: The system of any prior embodiment, wherein the method further includes applying the wettability index to downhole or surface NMR measurements of a subterranean region.

Embodiment 20: The system of any prior embodiment, wherein the method further includes performing at least one of planning a downhole operation and adjusting an operational parameter of the downhole operation based on the downhole measurements.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The terms "about", "substantially" and "generally" are intended to include the degree of error associated with measurement of the particular quantity based upon the equipment available at the time of filing the application. For example, "about" and/or "substantially" and/or "generally" can include a range of ±8% or 5%, or 2% of a given value.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A method of estimating a wettability characteristic of a rock material and fluid system, comprising:
   acquiring a sample of the rock material;
   performing a first nuclear magnetic resonance (NMR) measurement of the sample when the sample is in a full water saturation condition, and measuring a first T2 distribution;
   performing a second NMR measurement of the sample when the sample is in a second partial saturation condition, and measuring a second T2 distribution;
   separating a hydrocarbon component of the second T2 distribution from a water component of the second T2 distribution;
   applying a fluid substitution model to the water component of the second T2 distribution to generate a computed T2 distribution, wherein the fluid substitution model is configured to generate the computed T2 distribution, the fluid substitution model including an assumption that the sample is water wet and fully saturated with water, the computed T2 distribution representing a reconstruction of the first T2 distribution under the assumption that the sample is water wet and fully saturated with water; and
   calculating a wettability index (WI) based on a difference between the first T2 distribution and the computed T2 distribution.

2. The method of claim 1, wherein the second saturation condition is an irreducible water saturation (Swirr) condition or a residual oil saturation (1−Sor) condition.

3. The method of claim 1, wherein the fluid substitution model includes a plurality of mapping relations configured to map the water component of the second T2 distribution to the computed T2 distribution under the assumption, and a total porosity constraint.

4. The method of claim 1, wherein the fluid substitution model includes an irreducible water model and a pore water saturation model, and a total porosity constraint.

5. The method of claim 1, further comprising applying a fitting function to separate the hydrocarbon component and the water component from the second T2 distribution.

6. The method of claim 5, wherein the fitting function is a gamma fitting function.

7. The method of claim 1, wherein the wettability index is calculated based on:

$$WI = \log\left(\frac{std(T2_{computed} - T2_{measured})}{std(T2_{measured})}\right),$$

wherein $T2_{computed}$ is the computed T2 distribution, and $T2_{measured}$ is the first T2 distribution.

8. The method of claim 1, further comprising applying the wettability index to downhole or surface NMR measurements of a subterranean region.

9. The method of claim 8, further comprising performing at least one of planning a downhole operation and adjusting an operational parameter of the downhole operation based on the downhole NMR measurements.

10. A system for estimating a wettability characteristic of a rock material, the system comprising:
    a nuclear magnetic resonance (NMR) device configured to perform NMR measurements of a sample of the rock material; and a processor configured to perform a method including:

performing a first NMR measurement of the sample when the sample is in a full water saturation condition, and measuring a first T2 distribution;

performing a second NMR measurement of the sample when the sample is in a second partial saturation condition, and measuring a second T2 distribution;

separating a hydrocarbon component of the second T2 distribution from a water component of the second T2 distribution;

applying a fluid substitution model to the water component of the second T2 distribution to generate a computed T2 distribution, wherein the fluid substitution model is configured to generate the computed T2 distribution, the fluid substitution model including an assumption that the sample is water wet and fully saturated with water, the computed T2 distribution representing a reconstruction of the first T2 distribution under the assumption that the sample is water wet and fully saturated with water; and calculating a wettability index (WI) based on a difference between the first T2 distribution and the computed T2 distribution.

11. The system of claim 10, wherein the second saturation condition is an irreducible water saturation (Swirr) condition or a residual oil saturation (1−Sor) condition.

12. The system of claim 10, wherein the fluid substitution model includes a plurality of mapping relations configured to map the water component of the second T2 distribution to the computed T2 distribution under the assumption.

13. The system of claim 10, wherein the fluid substitution model includes an irreducible water model and a pore water saturation model, and a total porosity constraint.

14. The system of claim 10, wherein the method further includes applying a fitting function to separate the hydrocarbon component and the water component from the second T2 distribution.

15. The system of claim 14, wherein the fitting function is a gamma fitting function.

16. The system of claim 10, wherein the wettability index is calculated based on:

$$WI = \log\left(\frac{std(T2_{computed} - T2_{measured})}{std(T2_{measured})}\right),$$

wherein $T2_{computed}$ is the computed T2 distribution, and $T2_{measured}$ is the first T2 distribution.

17. The system of claim 10, wherein the method further includes applying the wettability index to downhole or surface NMR measurements of a subterranean region.

18. The system of claim 17, wherein the method further includes performing at least one of planning a downhole operation and adjusting an operational parameter of the downhole operation based on the downhole NMR measurements.

* * * * *